United States Patent [19]
Hohhof

[11] 3,990,007
[45] Nov. 2, 1976

[54] PROGRAMMABLE FREQUENCY DETECTOR

[75] Inventor: Kenneth J. Hohhof, Des Plaines, Ill.

[73] Assignee: GTE Automatic Electric Laboratories Incorporated, Northlake, Ill.

[22] Filed: Mar. 31, 1975

[21] Appl. No.: 563,925

[52] U.S. Cl. .............................. 324/78 Q; 324/78 D; 328/141
[51] Int. Cl.[2] .......................................... G01R 23/02
[58] Field of Search .............. 324/28 Q, 78 Z, 78 D; 328/134, 141, 151

[56] References Cited
UNITED STATES PATENTS

| | | | |
|---|---|---|---|
| 3,735,387 | 5/1973 | Miller | 324/78 D |
| 3,760,269 | 9/1973 | Beeman | 324/78 D |

OTHER PUBLICATIONS
Seith, "Frequency Deviation Indicator", IBM, Tech. Disclosure Bulletin, vol. 4, No. 11, Apr. 1962, pp. 38, 39.

*Primary Examiner*—R. V. Rolinec
*Assistant Examiner*—Michael J. Tokar

[57] ABSTRACT

A programmable frequency detector is provided for determining if the frequency of an input signal is above, below, or within a programmable tolerance of a programmable frequency. A counter circuit is provided that is enabled by a timing stage during a predetermined calculation period to count the input frequency; the counter output is then compared to a programmed frequency code input by a comparator stage. A latch circuit and the timing circuits then utilize the comparator output to determine if the input frequency was high, low, or within the pass tolerance band.

5 Claims, 5 Drawing Figures

PROGRAMMABLE FREQUENCY DETECTOR

BACKGROUND OF THE INVENTION

1. Field of the Invention

The present invention relates generally to the field of frequency detectors and more particularly to programmable frequency detector circuit for determining if the frequency of an input signal is above, below, or within a programmable tolerance of a programmable frequency.

2. Description of the Prior Art

In modern electronics systems, many times it is necessary to test the output of certain tone generator or oscillator circuits to determine if the frequency is above, below, or within a given tolerance range of a predetermined frequency.

A preliminary novelty search revealed the following patents to which reference may be made to ascertain the prior art; U.S. Pat. Nos. 3,537,001, 3,566,263, 3,614,619, 3,696,293, and 3,737,789.

Many circuit configurations have been devised to compare various input frequencies relative to each other and internal standards with an output indicating the deviation between the inputs and internally generated signals. Further, other circuit configurations have been utilized to filter out undesired frequencies by passing only those frequencies within the pass-band about the desired frequency. However none of the prior art circuit configurations provide a simple and economical method of determining if the frequency of an input signal is above, below, or within a programmable tolerance of a programmable frequency during a calculation time period.

OBJECTS AND SUMMARY OF THE INVENTION

Accordingly it is a principal object of the present invention to provide a programmable frequency detector circuit utilizing novel monostable timing circuitry for determining if the frequency of an input signal is above, below, or within a programmable tolerance or pass-band of a programmable frequency during a given predetermined calculation time period.

Another object is a programmable frequency detector circuit that may be incorporated in a test set which is easily and simply programmable to test a wide variation of input frequencies and provide outputs indicating whether the input frequency is above, below, or within a programmable tolerance.

These and other objectives of the present invention are efficiently achieved by providing digital counter means to which the input signal is applied, digital comparator means which are connected to the digital counter means outputs and capable of being programmed to various frequencies for comparing the output count of the digital counter means to the programmed frequency, and timing means for generating programmable tolerance outputs that are indicative of the high and low tolerance periods relative to the calculation time period. The outputs of the timing means and the digital comparator means are then compared in latching means circuitry to produce an output indicating whether the input frequency is above, below, or within the programmed tolerance of the programmable frequency.

Other objects will appear from time to time in the ensuing specification, drawings, and claims.

DESCRIPTION OF THE PREFERRED EMBODIMENT

Figure 1:
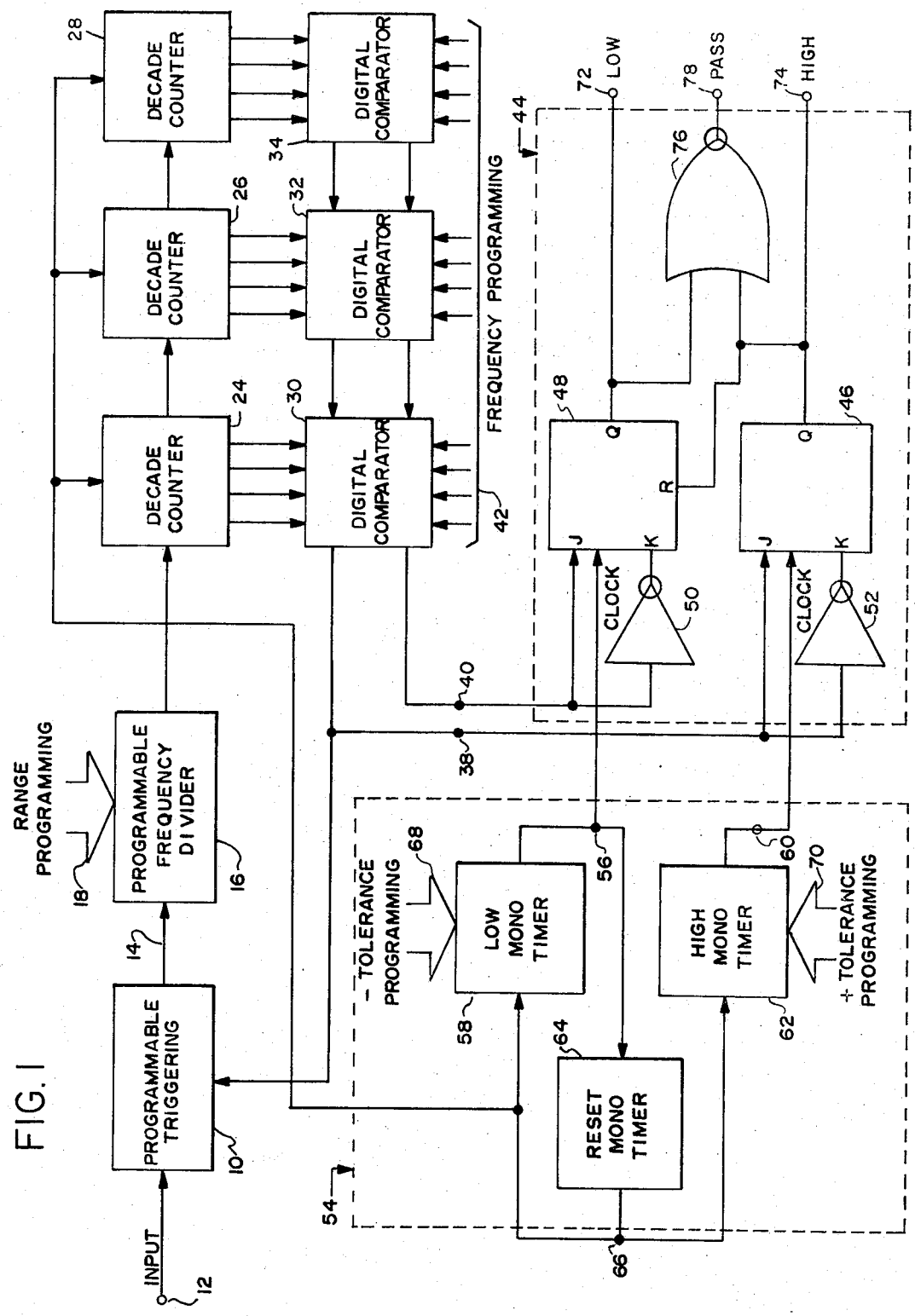
FIG. 1 is a block diagram representation of the programmable frequency detector circuitry of the present invention.

The programmable frequency detector of FIG. 1 includes a programmable triggering stage 10 with input terminal 12 to which the input signal is connected. The frequency range of typical input signals is approximately 100 Hz to 100 Khz although it should be understood that lower or higher frequency ranges can also be accommodated. The programmable triggering stage 10 is a wave shaping stage such as a conventional Schmitt triggering circuit and also may include a one shot multivibrator to further square the incoming wave-form so as to produce iniform pulses to the other stages as will be discussed in more detail hereinafter. The output 14 of the programmable triggering stage 10 is connected to a programmable frequency divider stage 16 which is programmed by range programming input lines 18 to either divide the incoming signal by a factor of ten or to pass the input signals without performing the division function. While a division by 10 frequency divider stage has been described, it should also be understood that the programmable frequency divider stage 16 might include any number of programmable division ranges as the input frequencies may dictate. In any case, the output 20 of the programmable frequency divider 16 is coupled to digital counter means 22 which includes decade counter stages 24, 26, and 28 which are connected in cascade to generate output counts in binary coded form, such as BCD output coding, so that the four output lines of each decade counter stage 24, 26, and 28 represent the 10's, 100's, and 1,000's digits respectively of the decimal equivalent of the incoming or divided wave-form. In this manner the digital counter means 22 counts from 1 to 9,999.

The binary outputs of decade counter stages 24, 26, and 28 are coupled to a digital comparator means comprising the digital comparator stages 30, 32, and 34 respectively. The digital comparator stages 30, 32, and 34 are also cascade connected so as to perform a comparator function of the complete binary encoded number as represented by the outputs of counter stages 24, 26, and 28. The > (greater than) and = (equal to) outputs of each preceding comparator stage is forward fed or carried through to the next succeeding comparator stage such as 34 to 32, and 32 to 30. Each succeeding comparator stage has an = to input and a > input. The outputs of digital comparator stage 30 at terminals 38 and 40 then indicate whether the binary encoded number inputted from decade counters 24, 26, and 28 is > or < (less than) the binary word or number inputted or programmed by frequency programming lines 42 which supply a 10's digit to digital comparator stage 30, a 100's digit to digital comparator stage 32, and a 1,000's digit to digital comparator stage 34. The > output at terminal 38 is then at a logical one or high level when the binary number from the decade counters is > the binary number inputted at frequency programming lines 42 to the digital comparator stage inputs. Correspondingly, the < output at terminal 40 is a logical one level or high when the binary number at the decade counter outputs is lower than the corresponding frequency programmed binary number from inputs 42. The frequency programming lines 42 are set by logic levels from thumb wheel switches or other logic programming such as logic gates to the desired test frequency corresponding to the nominal input frequency at input 12 to be tested divided by the factor, e.g. 10, programmed by the range programming lines 18.

The digital comparator means outputs 38 and 40 are coupled to the latching means 44 with the > output 38 being connected to the J input of a flip-flop or first latching stage 46 and the < output 40 being connected to the J input of a second flip-flop or second latching stage 48. The J input of flip-flop 48 is also connected through an inverter gate 50 to the K data input of flip-flop 48. Correspondingly the J input of flip-flop 46 is connected through an inverter gate 52 to the K data input of flip-flop 46.

The clock or toggle inputs of flip-flops 46 and 48 are connected to outputs of a timing means 54 that generates programmable tolerance periods. The clock input of flip-flop 48 is connected to the output 56 of a first programmable monostable multivibrator or timer 58 and the clock input of flip-flop 46 is connected to the output 60 of a second programmable monostable multivibrator or timer 62. Both the monostable multivibrators 58 and 62 are driven or triggered by a third monostable multivibrator or timer 64 whose output 66 is also coupled to the decade counter stages 24, 26, and 28 to perform a reset function. The third monostable multivibrator 64 which performs the reset timer function is itself retriggered by the output 56 of the monostable multivibrator 58 which performs the low monostable timer function. The monostables 58 and 62 are programmable about a nominal timing period, e.g., 100 milliseconds by tolerance programming lines 68 and 70 respectively. The low monostable timer 58 is programmed by line 68 to a time equal to the nominal period of 100 milliseconds divided by one minus a timing tolerance equivalent to the lower acceptable frequency tolerance desired. For example if the input frequency at the output 20 of the programmable frequency divider 16 is 1,000 Hz, and if a 10% frequency deviation or tolerance is acceptable, corresponding to 1.1 Khz and 900 Khz, the pulse duration of timer 58 is programmed for 111 milliseconds, approximately, which corresponds to the 900 Hz acceptable low frequency input. Correspondingly, the high timer 62 is programmed to a time equal to the nominal time period divided by one plus a timing tolerance equivalent to the higher frequency, or, for example, 91 milliseconds approximately corresponding to the 1.1 Khz high frequency acceptable input signal. Although a nominal calculation time period of 100 milliseconds is described herein, it should be understood that other calculation periods are also acceptable with appropriate percentage tolerance limits determining the time periods of the low and high timers as will a suitable adjustments to the counter and comparator circuitry. The pulse duration of reset mono-timer 64 is set to approximately 30 milliseconds to allow the low and high timers 58 and 60 to stabilize and recover. A time delay to the initiation of the pulse of reset mono-timer 64 is incorporated within timer 64 to further allow for stabilization and proper resetting of the low and high mono-timers 58 and 62.

Further while a plus and minus 10% frequency tolerance limit is discussed, the tolerance programming 68 and 70 may also include other desired frequency tolerances such as 1%, 5%, and 20% by adjusting the pulse durations of timers 58 and 62 appropriately. Such tolerance time periods may be digitally programmed or switched.

The Q output of flip-flop 48 and latching means 44 forms the low failure output 72 of the programmable frequency detector while the Q output of flip-flop 46 forms the high failure output 74. The Q output 74 is also connected to the reset of flip-flop 48 whose function will be described in detail hereinafter. Further the two Q outputs of flip-flops 46 and 48 are coupled to a two input NOR gate 76 whose output forms the pass or acceptable tolerance limit output 78.

In operation, and after a reset by the reset mono-timer 64, the decade counter stages 24, 26 and 28 start counting the input wave-form from programmable frequency divider 16 with the digital comparator outputs 38 and 40 indicating when the counted input wave-form is < or > the programmed count or frequency from program lines 42. For example if a nominal 100 millisecond calculation period is utilized, frequency programming lines 42 are digitally programmed for a count of 100 which corresponds to a zero for comparator stage 34, a one for stage 32, and a zero for stage 30, coded into binary coded decimal inputs. When the decade counter outputs exceed 100 counts the < output 40 which was previously a high logic level switches to a low logic level and the > output 38 which was previously a low switches to a high level. If this transition from a < to > condition occurs before the high monostable timer 62 has timed out, flip-flop 46 will indicate a true or high level Q output which indicates a high failure detection at output 74. If the < to > transition occurs both after the high timer 62 and the lower timer 58 have timed out, the Q output of flip-flop 48 will be high indicating a low failure detection at output 72 corresponding to the input frequency being < the programmed tolerance below the nominal frequency; in other words more than 10% lower then 1,000 Hz or less than 900 Hz. If the transition from a < to > condition occurs between the time outs of the high timer 62 and the low timer 58 neither Q output of flip-flops 46 or 48 will be high and a high logic level indicating a pass output to output 78 will result corresponding to the input frequency being within the range of 900 to 1,100 Hz. The programmable frequency detector then functions as a go-no-go detector and also determines whether the unknown frequency was below or above the acceptable frequency range as programmed by the tolerance program. After the high and low timers 58 and 62 time out, corresponding to the end of the calculation time period, a low, high, or pass indication will be present at 72, 74, and 78 respectively and the reset mono-timer 64 will reset the counting circuits as well as the timers 58 and 62 so that a low, pass, or high indication is given on a continuous basis. The low, pass, or high indication at outputs 72, 78, and 74 then remains or is latched until the end of the next calculation period so that the output can be observed to determine if the input frequency is continually above, below, or within a specified programmable frequency tolerance during successive calculation periods.

Figure 2:
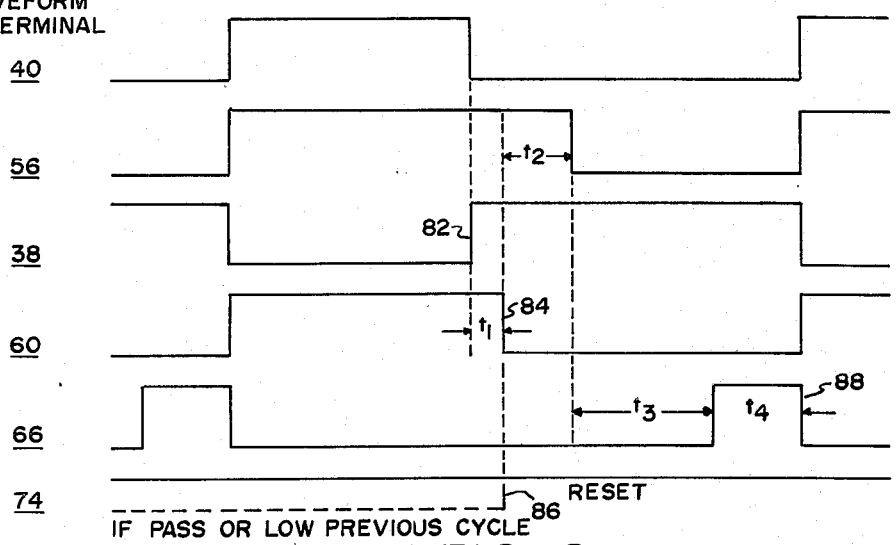
FIGS. 2, 3, and 4 are diagrammatic representations of the various wave-forms throughout the invention corresponding to high failure, pass (acceptable tolerance), and low failure conditions respectively.

In more detail, referring to FIG. 2, the wave-form at terminal 40 represents the < output of the digital comparator means 36 and the wave-form at terminal 38 represents the > output of the digital comparator means 36. Further the wave-form at terminal 56 and at terminal 60 represent the timing periods or pulse durations of the low and high tolerance timers 58 and 62 respectively which are initiated by the falling edge of the pulse wave-form at terminal 66 which is the output of the reset mono-timer 64. Since the output 66 of timer 64 also resets the decade counter, the < output 40 switches to a logic level and the > output wave-form at terminal 38 switches to a low logic level at the beginning of the calculation time period. The falling edge 88 of the wave-form at terminal 66 then represents the initiation of a calculation time period. For the example shown in FIG. 2, a rising edge 82 of the wave-form at terminal 38, < output, switches to a high logic level before the time out of the high mono-timer 62 indicated as the falling edge 84 of the wave-form at terminal 60. For example edge 82 occurs a period of time $t1$ before the time out at edge 84 of the wave-form at terminal 60. This indicates that the decade counter stages have counted to a higher number than that programmed into the digital comparators before the early time out corresponding to the input frequency being high than the programmed high tolerance. The time $t2$ of the wave-form at terminal 56 depicts the time difference between the high timer 62 time out and the low timer 58 time out which corresponds to the time difference in count from the high frequency limit to the low frequency limit of the input frequency. This time $t2$ then corresponds to the time period or "window" of time which encompasses the acceptable high and low frequency limits.

It can then be seen that the transition of the wave-form at terminals 38 and 40, the > and < outputs of the comparator, occurring within this window will give a pass indication whereas a transistion before the start of time $t2$ indicates a high frequency above the higher limit and a transition beyond the time $t2$ indicates a low frequency beyond the low frequency limit. The high failure output wave-form at terminal 74 then indicates a high at edge 84 of the wave-form 60, which is the time out of timer 62. This is represented by dashed rising edge 86 which occurs if the high failure output was low during the previous calculation period corresponding to a pass or low indication of the previous cycle. If the previous calculation period resulted in a high failure output, the high failure output merely remains high until the next calculation period. The time period $t3$ of the wave-form at terminal 66 is the reset delay time of timer 64 and $t4$ is the pulse duration of the reset mono-timer 66 whose falling edge 88 marks the beginning of a new calculation time period and a reset of the entire system. The high Q output of flip-flop 46 at output 74 also resets the low flip-flop 48 if it was previously at a high level. This eliminates the possibility of a high and low indication being present at the same time for the brief duration $t2$ until the low timer 58 has timed out switching the Q output of flip-flop 48 to a low.

Figure 3:
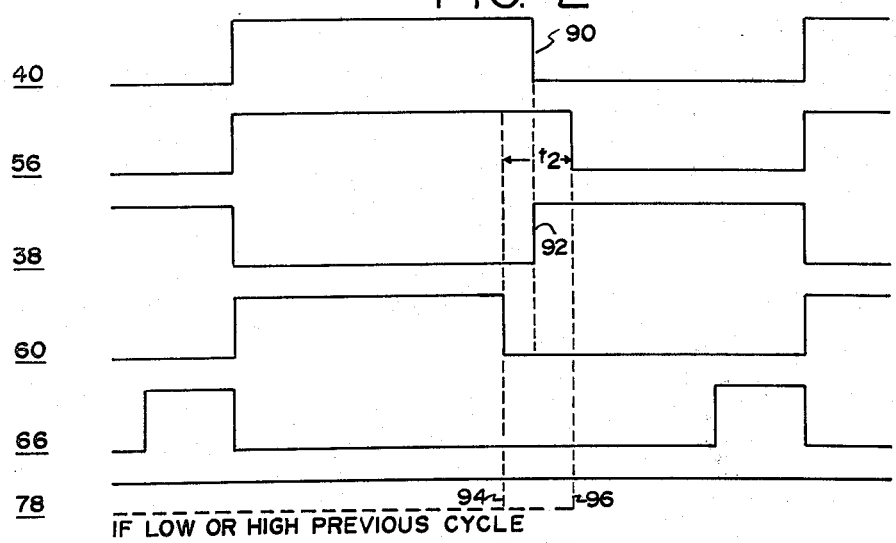
Figure 4:
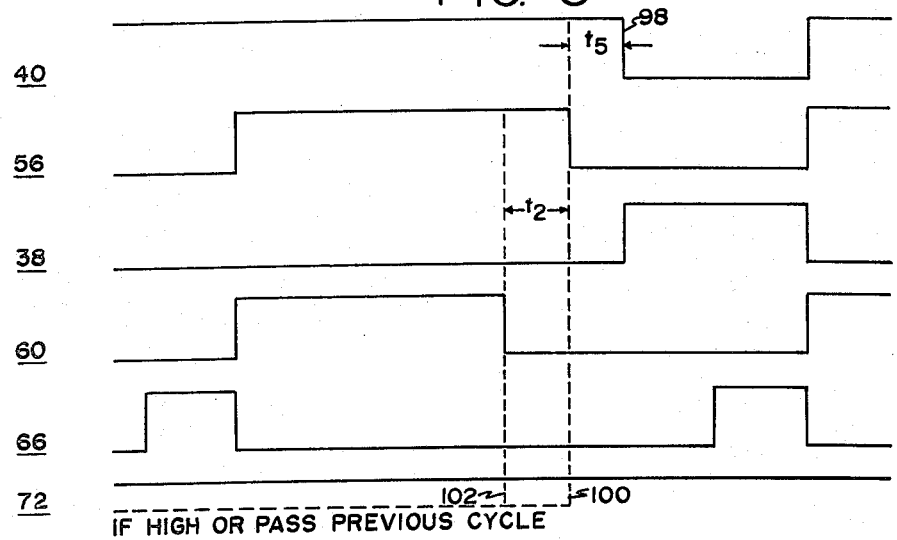

Referring now to FIG. 3, the example of a pass condition is shown corresponding to the input frequency being within the high and low frequency tolerances. As indicated previously, the transitions 90, 92 of the wave-forms at terminals 40 and 38 respectively occurring within the window of time $t2$ between the time out of wave-form 60 and 56 result in both Q outputs of flip-flops 46 and 48 being low. therefor the pass output 78 will switch to a high if it were not high during the previous calculation time period. The pass output 78 will switch to a high output at time edge 94 if a high failure indication were indicated the calculation time period previously and at time edge 96 if a low failure indication was present during the previous calculation period. Therefor Similarly in FIG. 4, a low failure situation is indicated by the transition of the wave-forms at terminals 40 and 38 occurring beyond the time out or pulse duration of the wave-form at terminal 56 with a high logic level occurring at the Q output of flip-flop 48. the transition of the wave-form at terminal 40, edge 98, occurs some time period $t5$ beyond the time of the low timer 56 which is a time period $t2$ plus $t5$ beyond the time out of the timer 62 indicated at the wave-form at terminal 60. The low failure indicator, wave-form at terminal 72, remains high if it was high during a previous calculation period or switches to a high level at time edge 100 at the time out of timer 58, low timer, if there were a pass indication the preceding cycle. If a high failure indication were present the previous cycle, a pass indication would momentarily be present between the time edge 102 and 100 or for the time period $t2$ and would then switch to a low failure indication at time edge 100. This is of course a very unlikely situation since it is not probable that the frequency will be switching between the high and low frequency limits at successive cycles.

The following list of circuit components has been found suitable for operation of the invention but should not be interpreted as limiting the design or functions of the invention: programmable frequency divider 16, and decade counters 24, 26, and 28, Teledyne Type 371 decade counter; a programmable triggering stage 10, monostable timers 58, 62, and 66, Teledyne Type 342 monostable multivibrators; digital comparator stages 30, 32, and 34, Teledyne Type 343 four bit digital comparators; flip-flops 46 and 48, Teledyne Type 312 dual J K flip-flops.

The programmable frequency detector of the present invention then provides an indication for determining if the frequency of an input signal is above, below, or within a programmable tolerance or pass band of a programmable frequency during a given predetermined calculation time period on a continuous basis over successive time periods.

Whereas the preferred form of the invention has been shown and described herein, it should be realized that there may be many modifications, substitutions, and alterations thereto without departing from the teachings of this invention.

Having described what is new and novel and desired to secure by letters patent, what is claimed is:

1. A frequency detector circuit for determining if the frequency of an input signal is above, below, or within a programmable tolerance of a programming frequency, comprising:

digital counter means for counting the number of periods of the input signal during a predetermined calculation period and for providing encoded signals corresponding to the number of periods of the input signal counted during the predetermined calculation period;

digital comparator means for comparing the encoded signals with a first set of encoded input signals corresponding to a number of periods of the programmed frequency during the predetermined calculation period and generating a first indication signal when the number of periods of the linput signal is less than the number of periods of the programmed frequency and generating a second indication signal when the number of periods of the input signal is greater than the number of periods of the programmed frequency;

programmable timing means for generating a first timing signal corresponding to the beginning of a modified calculation period in response to a first set of programmable tolerance input signals and for generating a second timing signal corresponding to the end of the modified calculation period in response to a second set of programmable tolerance input signals; and latching means for generating a first output signal indicating that the frequency of the input signal is above the programmable tolerance in response to the occurrence of the second indication signal after the first indication signal and before the first timing signal, a second output signal indicating that the frequency of the input signal is within the programmable tolerance in response to the occurrence of the second indication signal after the first indication signal and during the modified calculation period, and a third output signal indicating that the frequency of the input signal is below the programmable tolerance in response to the occurrence of the second indication signal after the first indication signal and after the second timing signal.

2. A frequency detector circuit as recited in claim 1 further including a programmable frequency divider means connected to said digital counter means for scaling down the input signal frequency to provide extended frequency range operation of the frequency detector circuit.

3. A frequency detector circuit as recited in claim 1 further including a programmable triggering means connected to said digital counter means for processing the input signal into a series of pulses whose edges have faster rise times than the wave-form form edges of the input signal.

4. A programmable frequency detector as recited in claim 1 wherein said programmable timing means includes a first timer means for generating the first timing signal, a second timer means for generating the second timing signal and a third timing means for resetting the digital counter means and said first and second timer means.

5. The programmable frequency detector circuit as recited in claim 4 wherein said latching means includes a first and second flip-flop circuit.

* * * * *

UNITED STATES PATENT AND TRADEMARK OFFICE
CERTIFICATE OF CORRECTION

PATENT NO. : 3,990,007
DATED : November 2, 1976
INVENTOR(S) : Kenneth J. Hohhof

It is certified that error appears in the above-identified patent and that said Letters Patent are hereby corrected as shown below:

Column 6, line 67, "linput" should be --input--.

Signed and Sealed this

First Day of February 1977

[SEAL]

Attest:

RUTH C. MASON
*Attesting Officer*

C. MARSHALL DANN
*Commissioner of Patents and Trademarks*